United States Patent [19]

Giles et al.

[11] Patent Number: 4,924,890

[45] Date of Patent: May 15, 1990

[54] METHOD AND APPARATUS FOR CLEANING SEMICONDUCTOR WAFERS

[75] Inventors: Brian A. Giles, Honeoye Falls; Frederick J. Schwab, Churchville, both of N.Y.

[73] Assignee: Eastman Kodak Company, Rochester, N.Y.

[21] Appl. No.: 864,633

[22] Filed: May 16, 1986

[51] Int. Cl.⁵ .............................................. B08B 3/10
[52] U.S. Cl. .................................. 134/61; 134/76; 134/102; 134/198; 134/184
[58] Field of Search ............... 134/61, 66, 76, 102, 134/133, 151, 198, 200, 184

[56] References Cited

U.S. PATENT DOCUMENTS

| | | | |
|---|---|---|---|
| 2,546,385 | 3/1951 | Christina | 134/89 |
| 2,559,921 | 7/1951 | Aiello et al. | 134/58 |
| 2,646,807 | 7/1953 | Martin | 134/58 |
| 2,692,603 | 10/1954 | Foote | 134/57 |
| 3,136,609 | 6/1964 | Ciagne | 23/267 |
| 3,276,983 | 10/1966 | Dolan et al. | 204/198 |
| 3,479,222 | 11/1969 | David et al. | 134/33 |
| 3,645,581 | 2/1972 | Lasch, Jr. et al. | 302/2 R |
| 3,812,947 | 5/1974 | Nygaard | 198/19 |
| 3,893,869 | 7/1975 | Mayer et al. | 134/184 X |
| 3,973,665 | 8/1976 | Giammanco | 198/19 |
| 4,064,885 | 12/1977 | Dussault et al. | 134/184 X |
| 4,132,567 | 1/1979 | Blackwood | 134/1 |
| 4,178,188 | 12/1979 | Dussault et al. | 134/1 |
| 4,217,977 | 8/1980 | Tam | 198/341 |
| 4,236,851 | 12/1980 | Szasz | 406/72 |
| 4,278,366 | 4/1981 | Loveless et al. | 406/88 |
| 4,282,825 | 8/1981 | Nagatomo et al. | 134/66 X |
| 4,315,705 | 2/1982 | Flint | 406/73 |
| 4,352,607 | 10/1982 | Loveless et al. | 406/88 |
| 4,401,131 | 8/1983 | Lawson | 134/149 |
| 4,458,703 | 7/1984 | Inoue et al. | 134/57 R |
| 4,458,704 | 4/1984 | Higdon | 134/57 R |
| 4,519,846 | 5/1985 | Aigo | 134/15 |
| 4,532,970 | 8/1985 | Tullis et al. | 141/98 |
| 4,534,389 | 8/1985 | Tullis | 141/98 |
| 4,561,144 | 12/1985 | Marais | 134/133 X |
| 4,694,527 | 9/1987 | Yoshizawa | 134/95 X |
| 4,722,355 | 2/1988 | Moe et al. | 134/94 X |
| 4,727,896 | 3/1988 | Kanazawa et al. | 134/184 |
| 4,736,758 | 4/1988 | Kusuhara | 134/76 X |

OTHER PUBLICATIONS

"SVG-18DWC Double Sided Wafer Cleaner", Silicon Valley Group, Inc., 9/80.

Primary Examiner—Frankie L. Stinson
Attorney, Agent, or Firm—Robert L. Randall

[57] ABSTRACT

A method and apparatus for cleaning and drying semiconductor wafers wherein the wafers may be stored in a wet environment until the cleaning step and wherein, after drying, the wafers are substantially isolated from the remainder of the apparatus and the workplace environment to prevent or at least substantially eliminate the recontamination of the wafer surface. The wafers are removed one at a time from an incoming storage bath and are transported to a cleaning station where they are cleaned and are then transported to a drying station. After being dried the wafers are transported to an output station where they are loaded into a portable enclosure member which substantially isolates the wafers in the enclosure from further contamination. Further, means is provided for introducing clean air into the drying station and venting at least a portion of the air through the cleaning station while at the same time substantially precluding the escape of air into the output station enclosure member. The cleaned wafer is substantially isolated during the cleaning and drying steps from the less clean portions of the method and apparatus thereby substantially preventing recontamination of the cleaned and dried wafer.

4 Claims, 7 Drawing Sheets

METHOD AND APPARATUS FOR CLEANING SEMICONDUCTOR WAFERS

BACKGROUND OF THE INVENTION

In the production of semiconductor devices, a plurality of chips are usually formed on a common semiconductor wafer which must pass through a plurality of processing steps including the steps of etching, coating, doping, plating, etc., until the desired multilayer configuration is achieved. After many of the steps, it is desirable to clean the wafer in order to remove contaminants and other particles generated during the previous operation in order to prepare the wafer for following operations. As the complexity of semiconductor chips increases, along with an ever decreasing size for the respective components therein, it becomes more and more important for ensuring that the wafers are adequately cleaned and dried between operations to assure the utmost cleanliness and the best possible yield, since any contamination carry-over may significantly affect the quality of the end product and the yield obtainable.

Although all of these factors have been known in the wafer production art, a variety of problems have been encountered in the cleaning and drying of wafers between production steps. Among these problems is the fact that wafers received from a wet processing operation are often stored in a dry environment. It has been found that when contaminants from prior operations are allowed to dry upon the surface of the wafer, they are significantly more difficult to remove during a subsequent cleaning operation than would be the case were the wafers stored in a wet environment before the cleaning operation. Similarly, it has been found that although the cleaning operation may satisfactorily remove the contaminants originally on the wafer surfaces, the wafers are recontaminated before they are removed from the cleaning apparatus, thus defeating much of the cleaning operation.

SUMMARY OF THE INVENTION

Accordingly, the present invention provides a method and apparatus for cleaning and drying semiconductor wafers wherein the wafers may be stored in a wet environment until the cleaning step and wherein, after drying, the wafers are substantially isolated from the remainder of the apparatus and the outside environment to prevent or at least substantially eliminate the recontamination of the wafer surface. Moreover, the present invention provides a method and apparatus wherein the wafers are removed one at a time from the incoming storage bath and are transported to a cleaning station where they are cleaned and are then transported to a drying station. After being dried the wafers are transported to an output station where they are loaded into a portable enclosure member which may be removed from the machine.

Furthermore, the present invention provides a method and apparatus for introducing clean air into the drying station and venting a first portion of the air through the cleaning station and a second portion of air through the working surface of the drying station. At the same time, the escape of air into the output station enclosure member is substantially precluded, thereby substantially preventing recontamination of the cleaned and dried wafer.

According to one aspect of the present invention, a method of cleaning and drying semiconductor wafers comprises the steps of: introducing a plurality of wafers contained in a holder or cassette into a storage bath at a receiving station, removing the wafers one at a time from cassette located in the storage bath and transporting the wafers one at a time to a cleaning station. The wafer is cleaned at the cleaning station, and is removed and transported to a drying station where it is dried. The dried wafer is removed from the drying station and transported to an output station and is loaded into a cassette and placed in a portable enclosure that can be removed from the machine.

According to another aspect of the present invention, apparatus is provided for cleaning and drying semiconductor wafers comprising a receiving station, a cleaning station, a drying station, and an output station. The receiving station includes a liquid bath, means for receiving a cassette containing a plurality of wafers, means for immersing the cassette containing the wafers in the liquid bath, and means for raising the cassette to present the uppermost wafer therein one at a time above the top of said bath. Means is provided for transporting the uppermost wafer from the cassette at the receiving station to the cleaning station to clean said wafer. Further means is provided for transporting the cleaned wafer from the cleaning station to the drying station to dry the wafer. The output station includes means for receiving a cassette having a plurality of generally vertically spaced horizontal slots each arranged to accept a cleaned wafer, a container member arranged to accept a cassette and to protect any wafers in the cassette from contamination, and means for moving the cassette one slot at a time from a position below the container member into the container member. Means is also provided for transporting the dried wafer from the drying station to the output station and for disposing the dried wafer into the uppermost empty slot in the cassette at the output station. Means are provided to lift the cassette and the cleaned wafer therein into the container member. Enclosure forming means is provided around the drying station and the means for transporting to and from the drying station, and means is provided for introducing clean air into the enclosure and for venting a first portion of the air through the cleaning station and a second portion of air through the working surface of the drying station. The escape of the air into the container member at the output station is substantially precluded thereby preventing the recontamination of cleaned and dried wafers.

Various means for practicing the invention and other features and advantages thereof will be apparent from the following detailed description of illustrative preferred embodiments of the invention, reference being made to the accompanying drawings.

DESCRIPTION OF THE PREFERRED EMBODIMENT

Figure 1:
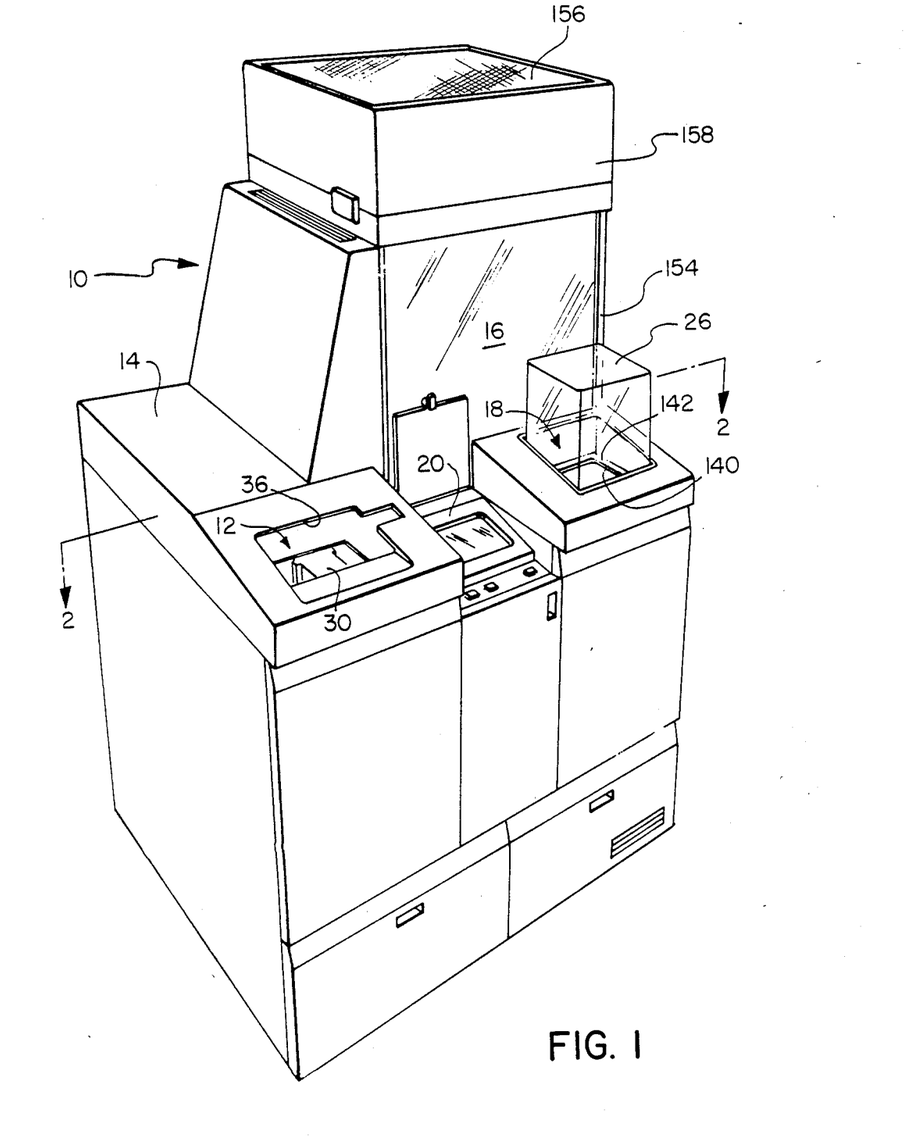
FIG. 1 is a perspective view of the exterior of the apparatus of the present invention.
Figure 2:
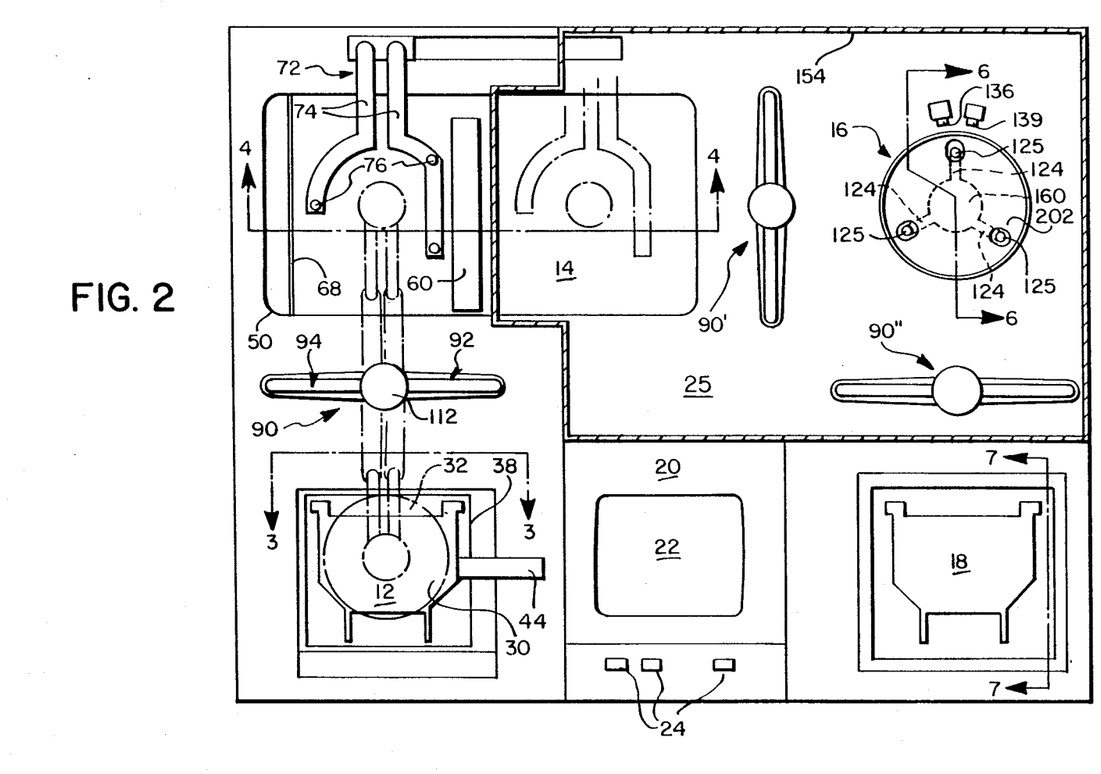
FIG. 2 is a partially schematic plan view of the apparatus showing the respective locations of the various operating stations of the present invention and taken along line 2—2 of FIG. 1.

Referring to FIGS. 1 and 2, a semiconductor wafer cleaning apparatus is illustrated which generally comprises an integrated system including a receiving station 12, a cleaning station 14, a drying station 16, and an output station 18, each of which will be more thoroughly described hereinbelow. A control station 20 including a CRT display 22 and appropriate control actuators 24 is also provided at the center of what is the "front" of the apparatus. It will be noted that all of the respective stations are disposed in substantially a common horizontal plane above a "working surface" 25 to facilitate the operation of the system as will be apparent hereinafter. The common horizontal plane is disposed at a suitable height for operator access.

Figure 7:
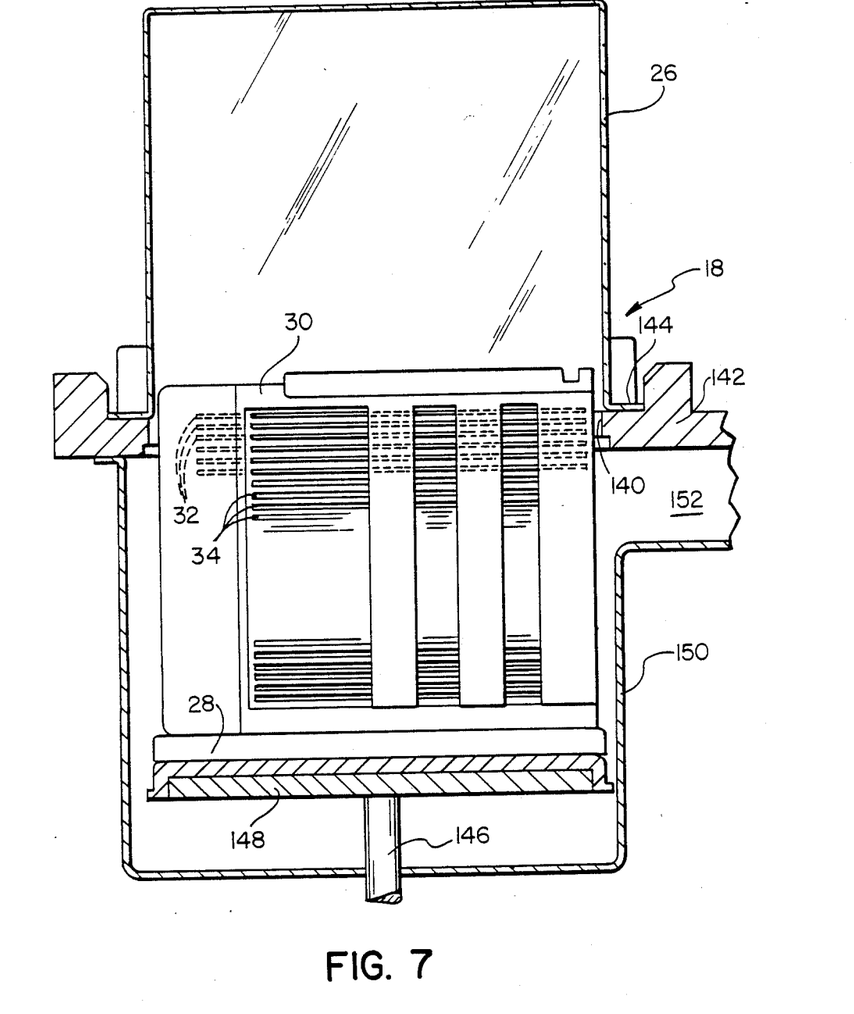
FIG. 7 is an elevation section taken along line 7—7 of FIG. 2 through the output station of the present invention.

The cleaning system of the present invention is particularly arranged and designed to interface with a standard mechanical interface for wafer cassette transfer (SMIF) proposed by Hewlett-Packard and described in U.S. Pat. Nos. 4,532,970 and 4,534,970 for a cassette transport box which provides an environmental housing for a plurality of semiconductor wafers. The transport box is indented to mate with semiconductor processing equipment and to enclose and protect a cassette for transfer of the wafers between various processing equipment, providing environmental protection for the wafers therein while at the same time facilitating the introduction and withdrawal of the wafers from the processing equipment. As illustrated in FIG. 7, the SMIF box comprises a container box 26 and a mating door 28. A wafer-accepting cassette 30 is arranged to be supported and accurately positioned by the door 28 and to be enclosed by the container box 26. A plurality of wafers 32 are accepted by a plurality of slots 34 in the cassette 30. The container box 26 is arranged to mate with the door 28 to provide a substantially dirt-proof closure for the handling of semiconductor wafers between various processing operations. A plurality of latches (not shown) are provided to secure the container box to the door and are preferably arranged for automatic operation when the SMIF box is mated with processing equipment whereby the door and the cassette seated thereon may be removed from the container box portion for the removal of the wafers for further processing while preventing any recontamination of the wafer surfaces.

Figure 3:
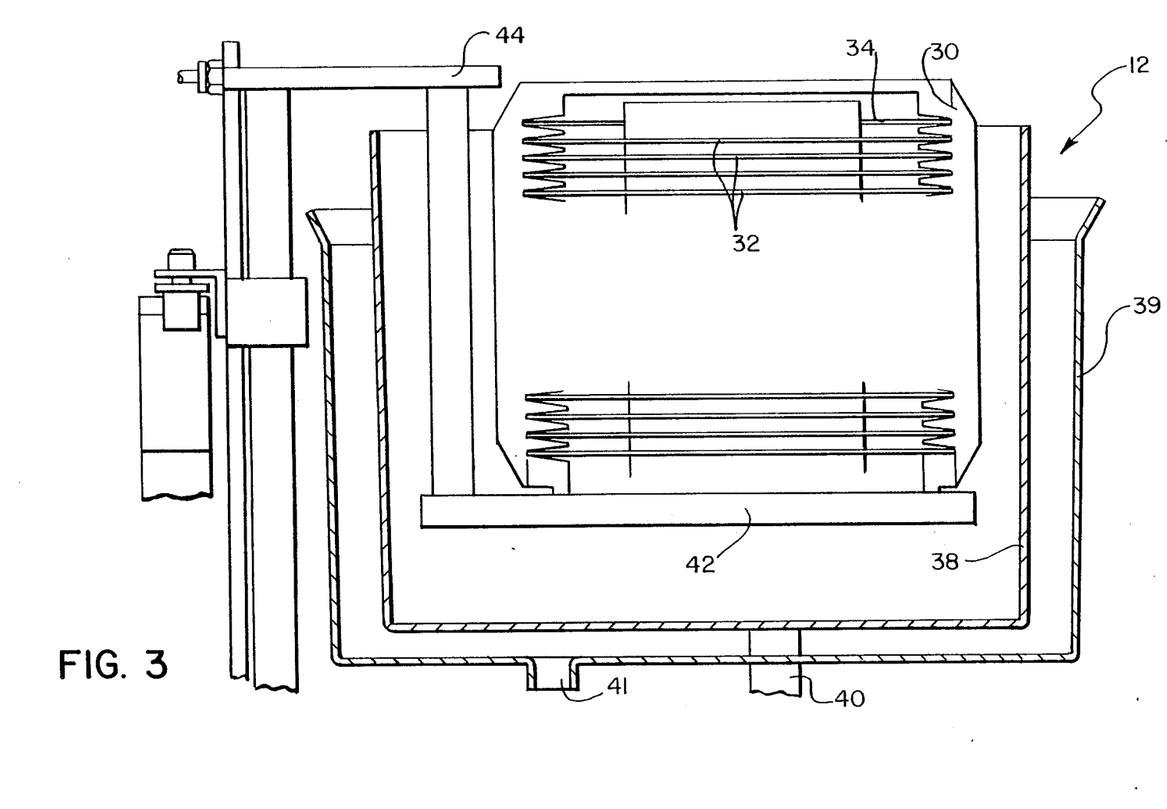
FIG. 3 is an elevation section looking into the receiving station taken along line 3—3 of FIG. 2.

The receiving station 12 comprises an opening 36 (FIG. 1) through the cover of the apparatus which is arranged to accept a cassette 30 containing a plurality of semiconductor wafers 32 which have been processed and are to be cleaned prior to further processing. Referring to FIGS. 2 and 3, the receiving station includes a container 38 provided with a liquid supply 40 and an outer overflow container 39 which is provided with a drain 41. The container 38 is intended to provide a liquid bath for the immersion of the incoming wafers prior to the cleaning operation and includes a movable platform 42 for receiving and locating the cassette 30 containing the wafers. The platform 42 is connected via arm 44 to elevator means, not illustrated, for raising and lowering the platform 42 in the container 38. The elevator means is arranged to raise the cassette to present the uppermost wafer therein, one at a time above the top of tank 38. Thus, the wafers may be kept immersed in the liquid until just prior to removal for cleaning and drying in the remainder of the apparatus. In this way wafers, which may have been through a wet processing step prior to transfer to the cleaning apparatus will be kept immersed in the liquid bath to prevent drying. Drying has been shown to render contaminants thereon more difficult to remove compared to wafers that are kept wet prior to the cleaning operation. While the receiving station is illustrated as having a wafer-carrying cassette only, it will be understood that it can also be adapted to receive a SMIF box, in a manner similar to the output station which is described below. Moreover, should it be undesirable to keep the wafers immersed in liquid prior to the cleaning step, the receiving station may be operated without liquid being provided to container 38.

Figure 4:
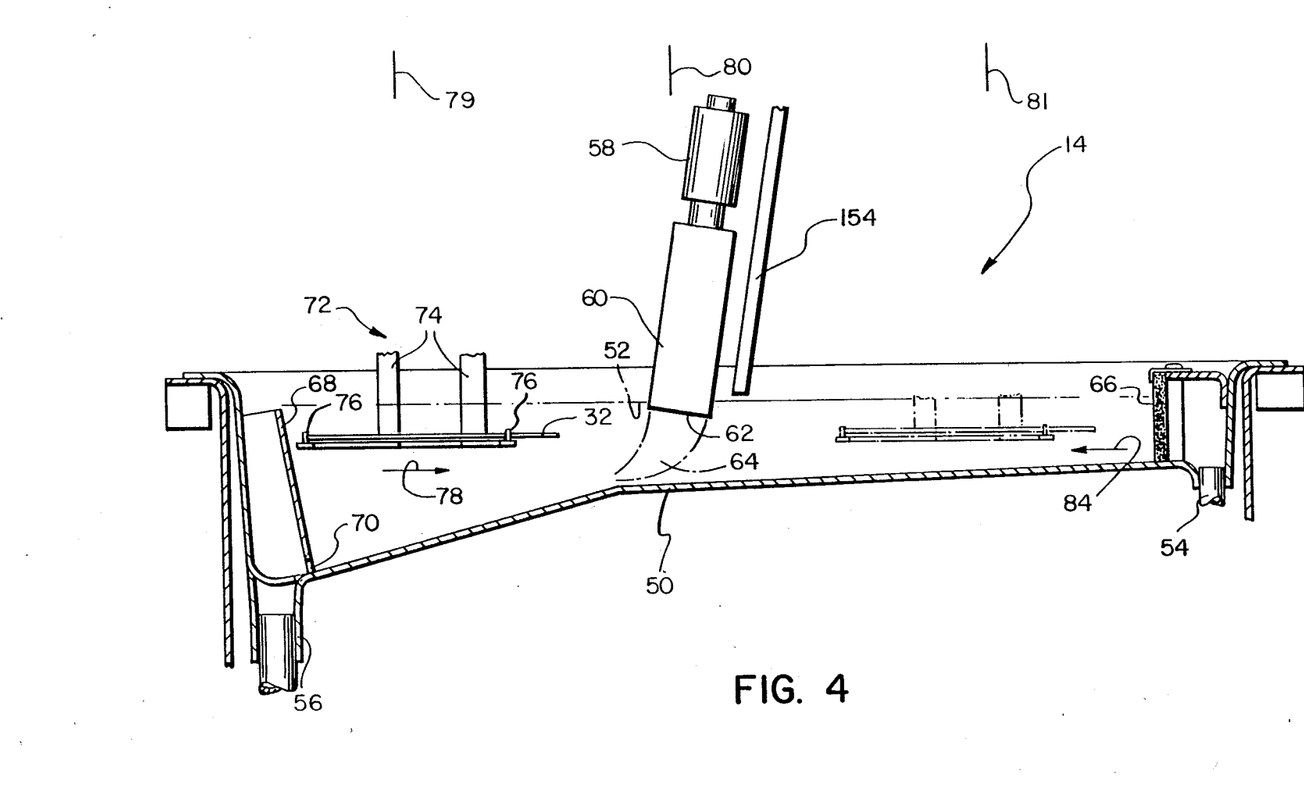
FIG. 4 is an elevation section through the cleaning station of the present invention taken along line 4—4 of FIG. 2.

A sectional side view through the cleaning station 14 is illustrated in FIG. 4. The cleaning station preferably comprises an ultrasonic cleaning apparatus substantially as described in copending application Ser. No. 846,630 filed in the name of White on May 16, 1986 now abandoned. The cleaning apparatus comprises a generally open top tank 50 arranged to contain a liquid bath having a liquid level 52, a liquid inlet 54 and a liquid outlet 56 at opposite ends thereof. An ultrasonic transducer 58 is coupled to an ultrasonic horn 60 having a radiating surface 62 disposed within the bath, substantially midway between the inlet and the outlet. The electroacoustic transducer imparts an ultrasonic vibration to the horn 60 which in turn develops a cavitation field 64 within the bath contained within tank 50. Preferably the transducer and horn create a well-defined and concentrated, high energy cavitation field or area through which the wafer is passed. The bath container 50 is provided with a width somewhat greater than the diameter of the largest semiconductor wafer intended for use therein. The length of the bath is at least twice the diameter of that wafer. The inlet end of the bath is provided with a flow diffuser 66 arranged to generate a generally non-turbulent flow throughout the bath area of the fluid introduced through inlet 54. The outlet end of the tank is provided with a fluid level-controlling weir 68 which functions to establish and control the liquid level. A drain 70 is also provided at the bottom of the weir to remove settled particulates during and after operation.

A wafer transport 72 is provided with a pair of movable arms 74 which are movable to grip, via pins 76, the edge of wafer 32, leaving both the surfaces open to contact with the bath fluid and prevent particulate retention on the surfaces. In the embodiment illustrated, the upper surface of the wafer is intended to be the primary surface cleaned by the action of the ultrasonic transducer and horn, but in fact both surfaces will undergo cleaning as the wafer is passed through the high energy cavitation field 64. In addition to the movement of the arms 74 to grip the wafer 32, the workpiece transport 72 is also arranged for vertical movement to receive the wafer from a wafer transfer apparatus above the bath and to lower the wafer below the surface of the bath, and for lateral motion along the length of the bath from the first position 79, illustrated in full in FIG. 4, in a first direction, indicated by arrow 78, to transport the wafer to the right beneath the radiating surface 62 of the horn 60, located at a second position 80, and then to a third, exit position 82 at the opposite end of the bath, illustrated in phantom in FIG. 4. The wafer transport may provide a range of transport speeds for the wafer of from one to three inches per second. The wafer transport is arranged to lift the cleaned wafer out of the tank at the exit position and to release it for transfer to other operational stations. The wafer transport 72 is then lowered to clear the horn and returned to the first position to receive the next wafer.

As illustrated, the radiating surface 62 of the horn 60 may be disposed at an angle of about 10° to the surface of the wafer 32 and facing the first position 79 where the wafer is loaded into the bath. The electroacoustic transducer 58 is arranged to provide an output of from about 70 to about 120 watts per square inch of the radiating surface of the horn at a frequency in the range of about 20 kHz to 90 kHz, emitting the ultrasonic energy into the bath in the form of a compact, well-defined area of intense cavitation 64. The horn is arranged so that it is adjustably disposed with respect to the liquid level and the wafer in the bath. The adjustment is sufficient to provide a range of distances between the radiating surface of the horn 62 and the top surface of the wafer 32 of from between about $\frac{1}{8}$ of an inch to about $\frac{3}{4}$ of an inch.

While the bath may be provided with any liquid media, or combination of media, which has been found satisfactory for cleaning semiconductor wafers, it has been found that use of ultrapure water provides certain advantages over other types of fluids. In this case ultrapure water is intended to refer to filtered and deionized water having a resistivity of at least 18 megohms, as is well-known in the art. The liquid media is introduced through inlet 54 and passes through the diffuser 66 which provides a uniform substantially nonturbulent flow of the fluid from inlet 54 to the outlet 56 passing the wafer and the electroacoustic transducer in a direction indicated by arrow 84, opposite to that of the movement of the wafer past the horn.

Figure 5A:
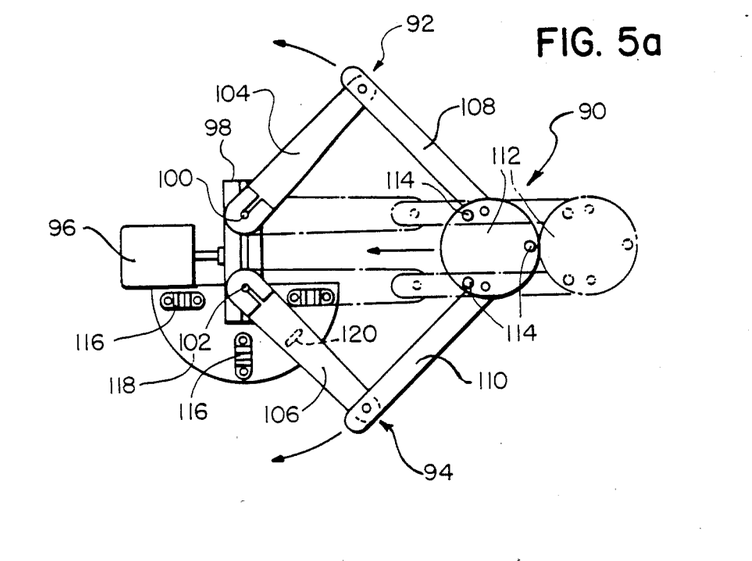
FIGS. 5a and 5b are plan views of the wafer transfer apparatus.
Figure 5B:
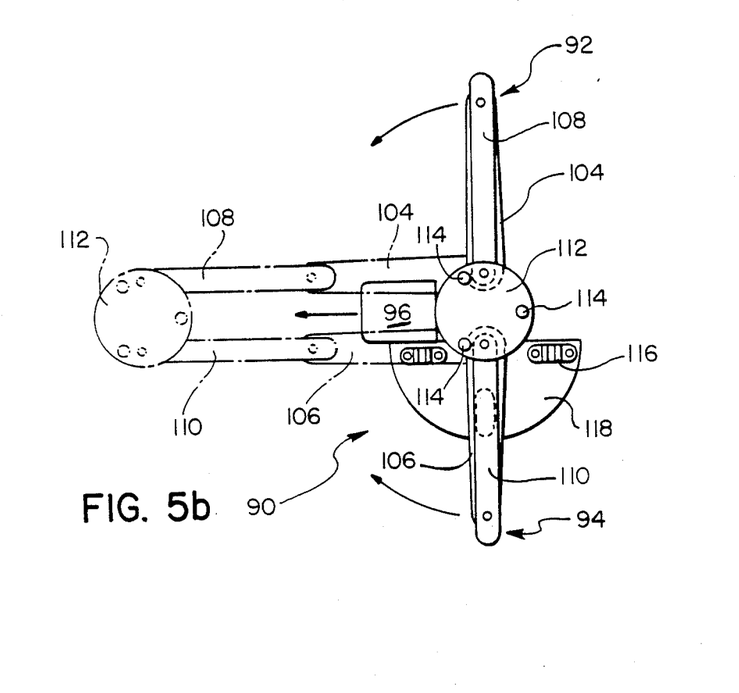

A wafer transfer mechanism 90 (FIG. 2) is disposed between the receiving station 12 and the cleaning station 14 to transfer individual wafers therebetween. The transfer mechanism may be of the type disclosed in copending application Ser. No. 864,632 filed in the name of Schwab on May 16, 1986 now abandoned. As disclosed therein, and as illustrated in FIGS. 5a and 5b, the transfer mechanism comprises a pair of compound arms 92 and 94, a motor 96, and a lifting means, not shown. A centrally disposed frame element 98 is provided with a pair of spaced, vertically parallel shafts 100 and 102, which respectively engage at the upper end, a first end of first arms, 104 and 106, of compound arms 92 and 94. Journaled at the second end of the first arms are respective second arms 108 and 110, each of which are connected at the second end thereof to an article support means or spatula 112 which may be provided with three equispaced wafer engaging bosses 114. The output shaft of motor 96 is provided with a worm gear which engages respective gears (not shown) at the lower end of each shaft 100 and 102 whereby as the motor output shaft rotates, shafts 100 and 102 rotate in opposite directions. As disclosed in the above-mentioned copending application in the name of Schwab, but not shown here, each of the first arms is provided with a drive means, such as a stationary pulley, disposed about the respective vertical shaft, 100 and 102, and a driven means such as a second pulley at the second end of arms 104 and 106 which is drivingly connected to the first end of the respective second arms 108 and 110. A means such as a drive belt connects the drive means with the driven means with a speed ratio of 2:1 whereby both the drive and driven means or pulleys move relatively in the same direction with respect to that arm. The result of this configuration is that, as the first arms 104 and 106 are moved in opposite directions by the motor 96, the second arms 108 and 110 are similarly driven in opposite directions, and in a direction opposite to that of the respective first arms to move the spatula 112 in a linear motion, passing over the center of the transfer means. Accordingly, and as illustrated sequentially in FIGS. 5a and 5b, the spatula in the right-most extended position is illustrated in phantom in FIG. 5a. As the motor drives the first arms 104 and 106 counterclockwise and clockwise, respectively, the second arms 108 and 110 revolve in a direction opposite to that of the motion of the respective first arms, thereby moving the spatula 112 to the position indicated in solid in FIG. 5a. After the first arms 104 and 106 have rotated 90° the position indicated in solid in FIG. 5b is reached, with the spatula disposed above the center of frame 98. As the first arms 104 and 106 continue their motion in the aforementioned directions, the spatula passes over the center of base 98 and, as the first arms reach a position 180° from the original position, the spatula reaches the left-most position, illustrated in phantom in FIG. 5b. It will thus be appreciated that the distance travelled by an article or wafer supported by the spatula 112 is equal to twice the combined length of the first and second arms of the mechanism.

Preferably the motor 96 is a reversible, stepper drive motor which can be accurately controlled by counting the number of revolutions, or portions thereof of the motor output shaft to determine the position of the transfer arms and to accurately control the disposition of the arms with respect to the overall mechanism and the placement of the wafer carried thereby. The motor is reversible to drive the arms and spatula in the opposite direction to that just described.

It will be noted that arms 108 and 110 are simple bar members having no complex mechanism therein and are made of relatively thin, flat materials. Likewise, the connection between the second ends of arms 108 and 110 with spatula 112 is a simple pivot requiring only a very simple bearing resulting in an overall thickness of the mechanism at the spatula which is very small. Accordingly, the mechanism can extend between closely spaced wafers in a cassette, as represented in FIGS. 3 and 7, without contacting either of the adjacent wafer. Lifting means (not shown) is provided for the transfer mechanism whereby the entire mechanism may be lifted by a small amount, e.g., 0.030 to 0.10 inch. Accordingly, the spatula may be introduced into the wafer-bearing cassette in the lowered position, with the spatula entering just below the wafer to be moved, and then the mechanism is raised, thereby engaging the wafer with the spatula and enabling the transfer mechanism to remove the wafer from the cassette.

The mechanism may be provided with a plurality of sensors 116 mounted on a support plate 118 beneath one of the compound arms 94, the first arm of which, 106, is provided with a sensor-activating blade 120 on the lower surface thereof which cooperates with the sensors to generate a signal when the transfer mechanism is in one of the three respective positions corresponding to the placement of the sensors. This signal may be used to calibrate the stepper counter for control of the stepper motor.

Figure 6:
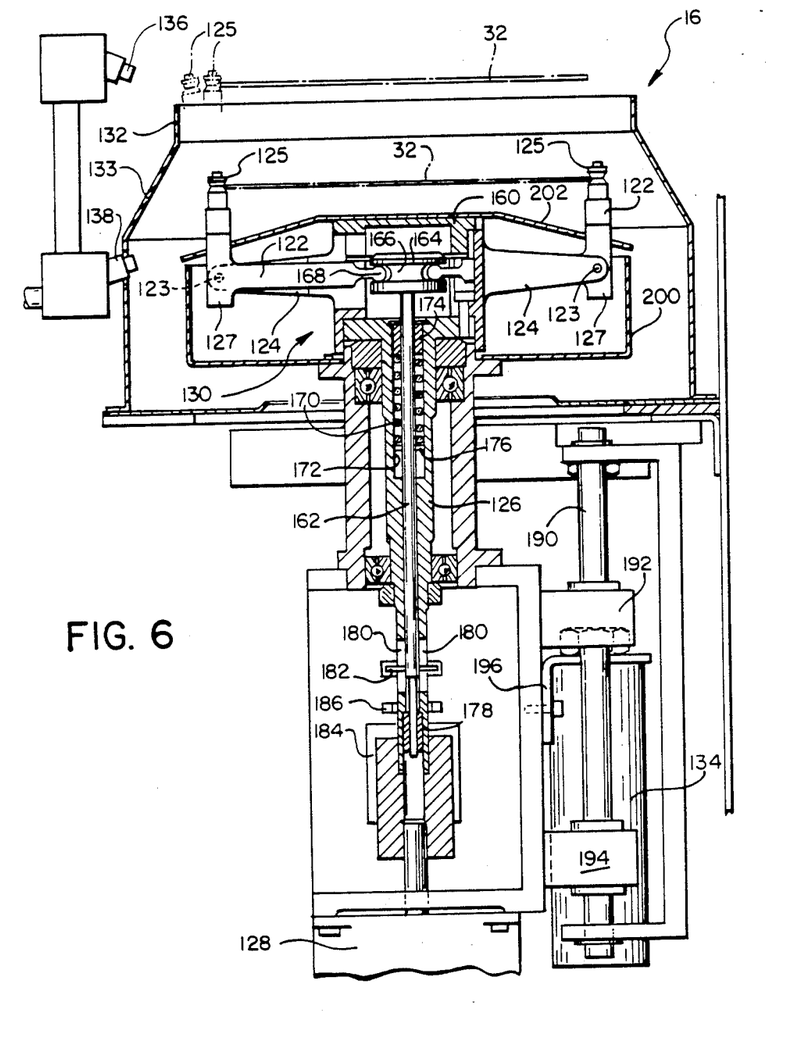
FIG. 6 is an elevation section taken along line 6—6 of FIG. 2 through the drying station.

A vertical elevation of the drying station 16 is illustrated in FIG. 6 and comprises a spin drying apparatus which may be of the type disclosed in copending application Ser. No. 864,634 filed in the name of Karl on May 16, 1986 now U.S. Pat. No. 4,651,440. As disclosed therein, the spin drying apparatus comprises a spinner arm assembly 130 having a plurality of L-shaped arms 122 pivotally mounted at 123 to radial arms 124 extending outward from the upper end of a rotatable vertical shaft 126. The shaft 126 is driven by a stepper motor 128 mounted at the lower end thereof. Each of the arms 122 is provided with a wafer-engaging tip 125 at the outer end which is arranged to engage only the edge of a wafer to be dried. The spinner arm assembly 130 also includes a substantially cylindrical hollow head member 160 which is connected at the upper end of the shaft 126 which is provided with a central bore through which extends an actuator rod 162. Rod 162 is provided with an enlarged upper end portion 164 within the cavity of head member 160. The end portion 164 is provided with an annular recess 166 which engages with the inner ends 168 of arms 122.

A compression spring 170 is disposed around rod 162 within an enlarged bore 172 within shaft 126. The spring 170 is compressed between a shoulder 174 at the upper end of bore 172, and a collar 176 at the lower end connected to rod 162. Thus, spring 170 exerts a downward force on rod 162 to downwardly rotate the horizontal portions of arms 122 thereby drawing the wafer engaging tips 125 into the wafer engaging position. The lower end of the rod 162 extends to the lower end of shaft 126 and terminates in a bushing 178. Just above the lower end of rod 162, shaft 126 is provided with a pair of diametrically opposite slots 180 through the wall thereof. A horizontal pin 182 is connected through the rod 162 at this point and extends outwardly through the slots 180 in shaft 126. Actuating means 184, either a solenoid or a pneumatic or hydraulic cylinder, is disposed on the far side of shaft 126 as illustrated in FIG. 6, with an operating shaft (not shown) extending upwardly therefrom parallel with shaft 126. At the upper end of the actuator shaft, a fork 186 is provided having arms which extend around either side of shaft 126 just below pin 182. Upon operation of actuator 184, the fork is raised into engagement with pin 182 lifting rod 162 within shaft 126. As the upper end portion 164 is raised, the arms 122 are pivoted upwardly whereby the pins 125 are rotated outwardly thereby releasing their grip on a wafer or in anticipation of the insertion of a new wafer into the spinner apparatus. When the actuator 184 is de-energized, the fork 186 is lowered, disengaging pin 182 and permitting spring 170 to force the rod 162 down rotating arms 122 about the pivots 123 whereby the pins 125 are again in wafer engaging position. It will be noted that the portion 127 of arms 122 below the pivot 123 is carefully designed to counterbalance and counteract any tendency of the upper portion of the arms to be pulled outward by centrifugal force during spinning, with a resultant reduction in force gripping the wafer.

The spinner arm assembly 130 is surrounded by a stationary cylindrical collector bowl 132, which is provided with an outwardly sloping shoulder 133 adjacent to the wafer 32. The bowl is arranged to confine any moisture centrifugally removed from the wafer and to prevent its escape into the remainder of the drying station or redeposition onto the wafer surface. A suitable drain not shown, is provided for the collector bowl. An inner cylindrical shield member 200 is also provided around the spinner head assembly and cooperates with a cover element 202 which is mounted to the head assembly for rotation therewith, to substantially enclose the entire rotating spinner head to minimize, if not eliminate, any air pumping caused by its rotation. It has been found that such air pumping can generate turbulent air flow about the wafer resulting in an increase in the recontamination of the wafer surface by particulate elements picked up by the turbulent air flow. As illustrated, the cover element 202 is provided with a sloping outer periphery to allow the lower spray head 138 to project a spray to the center of the lower surface of the wafer.

The entire spinner assembly, including the motor, is arranged to be lifted by a pneumatic or hydraulic cylinder 134 to raise the wafer-engaging tips 125 above the top of the collector bowl 132 for receiving and discharging wafers from the drying station. The spinner assembly is supported and guided for vertical movement by a pair of vertical guide rods, only one of which, 190, is illustrated. Two pair of bearing blocks 192 and 194 extend from the side of the spinner assembly and are provided with bearings which ride on the rods 190. The cylinder 134 is disposed between the rods and is also connected via bracket 196 to the side of the spinner assembly. The upper end of the piston rod (hidden behind rod 190) is fixed to the mounting frame for the spinner assembly. Thus, when the cylinder is actuated it is drawn up the piston rod, carrying the spinner assembly with it until the wafer 32 carried thereby reaches the position illustrated in phantom above the top edge of the collector bowl 132 where it is accessible to the wafer transfer mechanism for transfer either to or from the drying station.

Spray nozzles 136 and 138 are provided to spray water onto both surfaces of the wafer both to keep the wet wafer from drying due to evaporation prior to spin drying and to provide a final rinse. A second pair of nozzles, only one of which 139 is shown, spray both surfaces with nitrogen to assist in the drying during the spinning of the wafer.

Additional wafer transfer mechanisms 90'. and 90" (see FIG. 2) are provided, one between the cleaning station 14 and the drying station 16, and one between the drying station 16 and the output station 18.

A vertical elevation of the output station is illustrated in FIG. 7 and comprises an opening 140 in the top surface of the cleaning apparatus having a peripheral ledge 142 arranged to receive the flange 144 of the SMIF container box 26. As described in the patents disclosing the SMIF box arrangement, means (not shown) are also provided for unlatching latch members which connect the container box 26 to the box door 28. An elevator 146 is provided to engage and mate with the lower surface of door 28 to seal the contaminated outer surface thereof with the outer surface of the elevator platform 148 so that the door and elevator platform may be lowered into the clean environment of the outlet station as defined by wall member 150 without releasing particulate contaminants into the interior of the apparatus. The upper surface of the door 28 is arranged to mate with and orient the cassette 30 for receiving the wafers which are to be introduced into the empty cassette from the drying station 16. To permit this, an opening 152 is provided in the facing side of the outlet chamber to receive wafers moved from the drying station 16 by transfer mechanism 90".

Referring to FIGS. 1 and 2, an enclosure means comprising walls 154 is provided around the drying station 16 and the outlet end of the cleaning station 14. Fan means, not shown, is provided in the upper portion 156 of the enclosure chamber for introducing air filtered by a high efficiency filter 158 in the top of the enclosure into the enclosure area to provide substantially uniform laminar flow of the cleaned air down over the drying station. The filters 158 are sufficient to provide Class 10 air to the enclosure area. The air flow provided is sufficient to generate a positive pressure in the enclosure area to preclude the infiltration of any unfiltered air from the surrounding environment. The air is vented downwardly through openings (not shown) in the working surface 25 which forms the bottom of the drying chamber as well as outwardly under the edge of the wall portion adjacent the ultrasonic transducer horn 60 (see FIG. 4). It should be noted that no venting is permitted through the outlet station 18 thereby substantially eliminating any air flow into the outlet station and the container box 26 whereby introduction of particulate contaminants onto the wafers therein is substantially prevented.

It should be noted that much of the related apparatus of the system is disposed beneath the working surface 25. To ensure that any potential contaminants generated by this apparatus do not escape into the controlled environment above the working surface fan means (not shown) is provided to generate a negative pressure in the lower containment for this apparatus that assures that any air flow will be into that containment, not out of it. Such a fan means will exhaust to a suitable duct to remove the air to a remote location not affected by such potential contaminants. This low pressure area, in combination with the positive pressure in the enclosure area described above assure that the environment within the enclosure area remains at a Class 10 level.

The operation of the cleaning apparatus proceeds as follows. A cassette 30, containing a plurality of wafers 32 to be cleaned, is introduced into the receiving station 12 through opening 36 in the upper surface of the apparatus. The cassette is disposed on the raised elevator platform 42 which is lowered via arm 44 into the bath within container 38. The elevator is then reversed and moved upwardly a sufficient distance to expose only the top wafer therein above the top edge of tank 38. At this time the transfer mechanism 90 is actuated to move the spatula 112 into the cassette between the top two wafers therein. The transfer mechanism is then raised, freeing the top-most wafer 32 from the slot 34 in the cassette. The transfer mechanism is then reversed, moving the engaged wafer in a straight line from the receiving station 12 to the cleaning station 14 where it is placed in alignment with the wafer transport 72 which is then raised out of the bath in the first position. The movable arms 74 are closed so that the pins 76 thereon engage the edge of the wafer, gripping it securely. The transfer mechanism 90 is then lowered, disengaging the wafer, and is then retracted to the at-rest position illustrated in FIG. 2. The wafer is then held by the wafer transport 72 which then lowers it into the ultrasonic cleaning bath.

The cleaning station wafer transport 72 is then driven, to the right in FIGS. 2 and 4, moving the wafer in the direction of arrow 78 against the flow of the cleaning fluid, as indicated by arrow 84, passing beneath the ultrasonic transducer horn 60 and through the area of intense cavitation 64 which cleans the surfaces of the wafer. Any debris removed by the action of the ultrasonic cavitation is moved away from the clean portion of the wafer downstream by the flowing bath media. When the entire wafer has reached the third position, generally indicated at 81, beyond the ultrasonic transducer the wafer transport is stopped and is raised until the wafer is above the top of the container 50. The wafer transfer mechanism 90' is then extended in the lowered position to the left in FIG. 2, between the wafer and the wafer transport arm 74. The wafer transfer mechanism 90' is then raised whereby the bosses 114 on spatula 112 engage the lower surface of the wafer. The transport arms 74 are opened to release the wafer and the transfer mechanism 90' is operated, moving the wafer from the cleaning station 14 to the right to the drying station 16.

At the drying station the stepper motor has positioned the spinner arms 122 so that they will clear the transfer mechanism 90'. When the transfer mechanism has properly positioned the wafer with respect to the spinner assembly, the spinner head is raised above the top edge of the collector bowl 132 and the actuator 184 is activated whereby the pins 125 are open to accept the wafer. The actuator 184 is then deactivated, allowing the pins 125 to grip the edge of the wafer under the influence of spring 170. The transfer mechanism 90' is then lowered, disengaging the wafer, and the arms are returned to the at-rest position illustrated in FIG. 2. The spinner assembly is then lowered with the wafer into the collector bowl 132 and the motor 128 is actuated to rotate the spinner assembly. First the motor is operated at a relatively low speed and the water nozzles 136 and 138 are activated, providing a clean water rinse and preventing the surfaces from drying by evaporation. The motor speed is then increased to a high speed for a period of time during which all moisture is centrifugally thrown from the wafer surfaces. The nitrogen nozzles 139 are activated to facilitate the centrifugal drying process. Following the drying cycle, which may range in time from 9 to 12 seconds, the spinner is stopped and the arms are rotated to a position to clear the transfer mechanism 90" arms for unloading the wafer. The spinner head is again raised above the upper edge of the collector bowl 132 and the transfer mechanism 90", in the lowered position, moves the spatula 112 into alignment with the center of the wafer held by the spinner assembly. The transfer mechanism is then raised to engage the wafer 90" with the bosses 114 on spatula 112, and the arms 122 are opened to release the wafer. The transfer mechanism 90" is then actuated to remove the wafer from the drying station 16 to the output station 18.

At the output station, a SMIF box has previously been placed into alignment with the opening 140 and the elevator platform 148 has engaged the door 28 to lower it and the empty cassette 30 therein to the lowermost position therein. In this position the upper-most slot 34 of the cassette is in alignment with a wafer being transferred to the output station by transfer mechanism 90". After the transfer mechanism has delivered a cleaned and dried wafer into the upper-most slot 34, the transfer mechanism is lowered and removed from the output station. The elevator is then actuated to lift the cassette a distance equal to the distance between the top-most and the next slot in the cassette to await the arrival of the next wafer. It will be noted that, with the fact that there is no venting of the air from the drying station through the output station, and the fact that the wafer in the cassette is raised substantially above the inlet 152 to the output station, the possibility of recontamination of the cleaned upper surface of the wafer is substantially eliminated. After the cassette has been filled with cleaned and dried wafers, the elevator is raised to engage the SMIF box door 28 with the container box 26 and the latches are released to hold the box closed. The SMIF box containing the clean, dry wafers may then be removed and transported to the next processing step or for storage.

It will also be noted that the cleaning system of the present invention can be arranged to operate either with serial or parallel handling of wafers. Thus, as described above, a single wafer may be moved from the receiving station through the cleaning and drying stations to the output station prior to the removal of the next succeeding wafer from the cassette at the receiving station, or, preferably, the system may operate so that, as the dried wafer is removed from the drying station for transfer to the output station, a cleaned wafer is removed from the cleaning station, and the next wafer at the receiving station is removed and transferred to the input of the cleaning station, as well as other combinations of operating steps.

It will be appreciated by those skilled in the art that the provision of a Class 10 environmental hood over the drying station, and the controlled venting of the laminar flow of filtered air only through the cleaning station and downwardly through the bottom of the drying station, with no venting permitted through the output station, along with other features of the apparatus provide an advantageous method and apparatus for cleaning and drying semiconductor wafers.

The operational control of each of the stations or modules of the present apparatus is provided by a dedicated microprocessor which monitors and communicates with a system microprocessor which controls the interaction of the various modules. The system microprocessor also provides fault diagnostics and communication with the system interface for the production facility. The operator interface with the system is provided by a touch-sensitive CRT which allows the operator to control the operation of the system merely by pointing to the desired command displayed on the CRT 22 in FIG. 1.

It will also be appreciated that the described apparatus can be adapted to handle wafers of varying sizes by changing relatively simple adaptors on the components which contact the wafers without significant down time for the system.

Thus, the present invention provides an operating system wherein each component is selected and assembled so that it, along with the overall arrangement of the system, promotes and facilitates the prevention of recontamination of a cleaned wafer surface by subsequent operating procedures. Thus, the cleaning station assures that the already cleaned surface of the wafer passing the ultrasonic horn will not be recontaminated by suspended and recirculated particulates. Similarly, the venting of air from the drying station through the cleaning station assures that no particulates are carried from the cleaning station into the drying station. Further, the drying station itself is arranged, with non-turbulent downward flow of air and the collection of any moisture from the spun wafer as it is dried, so that any particulate matter, either solid or liquid, is sufficiently controlled that there is no opportunity for the particulate matter to recontaminate an already cleaned wafer surface. This concept is carried into the output station wherein the flow of any air, potentially contaminant-bearing, is substantially eliminated so that the cleaned and dried wafers are protected from recontamination as they are introduced and stored in the SMIF output box.

It will also be apparent that, although reference has been made throughout this disclosure to the cleaning and drying of semiconductor wafers, the term has been used for convenience and the present invention may be satisfactorily used for the production of other articles having similar characteristics such as photosensitive resists, masks, magnetic memory disks, etc.

The invention has been described with reference to specific embodiments and variations, but it should be apparent that other modifications and variations can be made within the spirit and scope of the invention, which is defined by the following claims.

What is claimed is:

1. Apparatus for cleaning and drying semiconductor wafers comprising a receiving station, a cleaning station, a drying station, and an output station;
   said receiving station including:
      means for receiving a cassette containing a plurality of wafers,
      a liquid bath,
      means for immersing said cassette containing said wafers in said liquid bath, and
      means for raising said cassette to present the uppermost wafer therein one at a time above the top of the bath;
   said output station including:
      means for receiving a cassette having a plurality of generally vertically spaced horizontal slots each arranged to accept a cleaned wafer,
      a container member arranged to accept a cassette and to protect any wafers in said cassette from contamination, and
      means for lifting said cassette one slot at a time from a position below said container member into said container member;
   means for introducing a cassette containing a plurality of wafers into said cassette receiving means;
   means for lowering said cassette and said wafers into said bath;
   means for raising said cassette to present the uppermost wafer therein one at a time above the top of the bath;
   means for transporting the uppermost wafer from said cassette at said receiving station to said cleaning station;
   means for cleaning said wafer;
   means for transporting said cleaned wafer from said cleaning station to said drying station;
   means for drying said wafer; and
   means for transporting said dried wafer from said drying station to said output station and for disposing said dried wafer into the uppermost empty slot in said cassette at said output station whereby said cassette and the cleaned wafer therein are lifted into said container member.

2. Apparatus for cleaning and drying semiconductor wafers comprising a receiving station, a cleaning station, a drying station, and an output station;
   said receiving station including:
      a liquid bath,
      means for receiving a cassette containing a plurality of wafers, means for immersing said cassette containing said wafers in said liquid bath, and means for raising said cassette to present the uppermost wafer therein one at a time above the top of said bath;

means for transporting the uppermost wafer from said cassette at said receiving station to said cleaning station to clean said wafer;

means for transporting said cleaned wafer from said cleaning station to said drying station to dry said wafer;

said output station including:

means for receiving a cassette having a plurality of generally vertically spaced horizontal slots each arranged to accept a cleaned wafer, a container member arranged to accept a cassette and to protect any wafers in said cassette from contamination, and means for moving said cassette one slot at a time from a position below said container member into said container member;

means for transporting said dried wafer from said drying station to said output station and for disposing said dried wafer into the uppermost empty slot in said cassette at said output station;

means for actuating said moving means to lift said cassette and the cleaned wafer therein into said container member;

means forming an enclosure around said drying station and said means for transporting to and from said drying station, and means for introducing clean air into said enclosue and for venting a first portion of said air through said cleaning station and for venting a second portion of said air downwardly through the bottom of said enclosure and for substantially precluding the escape of said air into said container member at said output station whereby to substantially eliminate the recontamination of cleaned and dried wafers.

3. Apparatus for cleaning and drying semiconductor wafers comprising an enclosure having a receiving station and an output station for introducing a plurality of wafers into and discharging a plurality of wafers from said enclosure, a cleaning station and a drying station within said enclosure:

means for introducing a plurality of wafers into a storage bath at said receiving station;

means for removing the wafers one at a time from said storage bath and transporting said wafers one at a time to said cleaning station;

means for individually cleaning each wafer at said cleaning station;

means for removing said cleaned wafer from said cleaning station and transporting said cleaned wafer to said drying station;

means for individually drying each wafer at said drying station;

means for removing said dried wafer from said drying station and transporting said dried wafer to said output station;

means for providing a portable container member at said output station;

means for loading said dried wafer into said portable container member;

means for substantially isolating said cleaned wafer at said cleaning and drying stations from the less clean stations of said apparatus to substantially prevent recontamination of said cleaned and dried wafer;

said enclosure means including a surface above which said cleaning and drying stations are located; and means for introducing clean air into said drying station and venting a first portion of said air through said cleaning station and a second portion of air through said surface at said drying station.

4. The apparatus according to claim 3 including means for substantially precluding the escape of said air into said container member.

* * * * *